US012283938B2

(12) United States Patent
McHugh

(10) Patent No.: US 12,283,938 B2
(45) Date of Patent: *Apr. 22, 2025

(54) DECOUPLED TRANSVERSELY-EXCITED FILM BULK ACOUSTIC RESONATORS

(71) Applicant: Murata Manufacturing Co., Ltd., Nagaokakyo (JP)

(72) Inventor: Sean McHugh, Santa Barbara, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/477,307

(22) Filed: Sep. 28, 2023

(65) Prior Publication Data
US 2024/0022228 A1    Jan. 18, 2024

Related U.S. Application Data

(63) Continuation of application No. 17/547,113, filed on Dec. 9, 2021, now Pat. No. 11,811,386, which is a
(Continued)

(51) Int. Cl.
*H03H 9/02* (2006.01)
*H03H 3/02* (2006.01)
(Continued)

(52) U.S. Cl.
CPC .......... *H03H 9/02228* (2013.01); *H03H 3/04* (2013.01); *H03H 9/02031* (2013.01);
(Continued)

(58) Field of Classification Search
CPC .. H03H 9/02228; H03H 3/04; H03H 9/02031; H03H 9/02102; H03H 9/174;
(Continued)

(56) References Cited

U.S. PATENT DOCUMENTS 5,705,399 A    1/1998   Larue
5,853,601 A    12/1998  Krishaswamy et al.
(Continued)

FOREIGN PATENT DOCUMENTS

CN    1926763 A    3/2007
CN    201893487 U   7/2011
(Continued)

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.
(Continued)

*Primary Examiner* — Jorge L Salazar, Jr.
(74) *Attorney, Agent, or Firm* — ArentFox Schiff LLP

(57) ABSTRACT

Acoustic resonator devices and filters are disclosed. An acoustic resonator includes a substrate and a piezoelectric plate supported by the substrate. A portion of the piezoelectric plate suspended across a cavity in the substrate forms a diaphragm. A decoupling dielectric layer is on a front surface of the diaphragm. An interdigital transducer (IDT) has interleaved fingers on the decoupling dielectric layer over the diaphragm. The IDT and piezoelectric plate are configured such that a radio frequency signal applied to the IDT excites shear acoustic waves in the diaphragm.

20 Claims, 8 Drawing Sheets

Related U.S. Application Data continuation of application No. 17/408,120, filed on Aug. 20, 2021, now Pat. No. 11,239,816.

(60) Provisional application No. 63/137,736, filed on Jan. 15, 2021.

(51) Int. Cl.
  *H03H 3/04* (2006.01)
  *H03H 9/17* (2006.01)
  *H03H 9/56* (2006.01)

(52) U.S. Cl.
  CPC ........ *H03H 9/02102* (2013.01); *H03H 9/174* (2013.01); *H03H 9/176* (2013.01); *H03H 9/562* (2013.01); *H03H 9/564* (2013.01); *H03H 9/568* (2013.01); *H03H 2003/023* (2013.01); *H03H 2003/0407* (2013.01); *H03H 2003/0442* (2013.01)

(58) Field of Classification Search
  CPC ........ H03H 9/176; H03H 9/562; H03H 9/564; H03H 9/568; H03H 2003/023; H03H 2003/0407; H03H 2003/0442; H03H 3/02; H03H 9/02015; H03H 9/02047; H03H 9/14544; H03H 9/582
  USPC .................................................. 333/193–196
  See application file for complete search history.

(56) References Cited

U.S. PATENT DOCUMENTS

| | | |
|---|---|---|
| 6,540,827 B1 | 4/2003 | Levy et al. |
| 6,707,229 B1 | 3/2004 | Martin |
| 7,135,940 B2 | 11/2006 | Kawakubo et al. |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,802,466 B2 | 9/2010 | Whalen et al. |
| 7,868,519 B2 | 1/2011 | Umeda |
| 8,278,802 B1 | 10/2012 | Lee et al. |
| 8,344,815 B2 | 1/2013 | Yamanaka |
| 8,829,766 B2 | 9/2014 | Milyutin et al. |
| 8,932,686 B2 | 1/2015 | Hayakawa et al. |
| 9,130,145 B2 | 9/2015 | Martin et al. |
| 9,219,466 B2 | 12/2015 | Meltaus et al. |
| 9,276,557 B1 | 3/2016 | Nordquist et al. |
| 9,369,105 B1 | 6/2016 | Li |
| 9,425,765 B2 | 8/2016 | Rinaldi |
| 9,525,398 B1 | 12/2016 | Olsson |
| 9,748,923 B2 | 8/2017 | Kando et al. |
| 9,780,759 B2 | 10/2017 | Kimura et al. |
| 10,200,013 B2 | 2/2019 | Bower et al. |
| 10,305,447 B2 | 5/2019 | Raihn et al. |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,756,697 B2 | 8/2020 | Plesski et al. |
| 10,790,802 B2 | 9/2020 | Yantchev et al. |
| 10,797,675 B2 | 10/2020 | Plesski |
| 10,826,462 B2 | 11/2020 | Plesski et al. |
| 10,868,513 B2 | 12/2020 | Yantchev |
| 11,239,816 B1 * | 2/2022 | McHugh ............ H03H 9/02015 |
| 11,811,386 B2 * | 11/2023 | McHugh .................. H03H 3/02 |
| 2002/0079986 A1 | 6/2002 | Ruby et al. |
| 2002/0158714 A1 | 10/2002 | Kaitila et al. |
| 2003/0199105 A1 | 10/2003 | Kub et al. |
| 2004/0041496 A1 | 3/2004 | Imai et al. |
| 2004/0090145 A1 | 5/2004 | Bauer et al. |
| 2004/0207033 A1 | 10/2004 | Koshido |
| 2004/0207485 A1 | 10/2004 | Kawachi et al. |
| 2004/0261250 A1 | 12/2004 | Kadota et al. |
| 2005/0280476 A1 | 12/2005 | Abe et al. |
| 2006/0072875 A1 | 4/2006 | Bhagavatula et al. |
| 2006/0125489 A1 | 6/2006 | Feucht et al. |
| 2006/0131731 A1 | 6/2006 | Sato |
| 2006/0152107 A1 | 7/2006 | Tanaka |
| 2006/0222568 A1 | 10/2006 | Wang et al. |
| 2007/0001549 A1 | 1/2007 | Kando et al. |
| 2007/0090898 A1 | 4/2007 | Kando |
| 2007/0170565 A1 | 7/2007 | Hong et al. |
| 2007/0188047 A1 | 8/2007 | Tanaka |
| 2007/0194863 A1 | 8/2007 | Shibata et al. |
| 2007/0267942 A1 * | 11/2007 | Matsumoto ............ H03H 9/178 310/366 |
| 2010/0064492 A1 | 3/2010 | Tanaka |
| 2010/0102669 A1 | 4/2010 | Yamanaka |
| 2010/0107388 A1 | 5/2010 | Iwamoto |
| 2010/0123367 A1 | 5/2010 | Tai et al. |
| 2010/0212127 A1 | 8/2010 | Heinze et al. |
| 2010/0223999 A1 | 9/2010 | Onoe |
| 2010/0301703 A1 | 12/2010 | Chen et al. |
| 2011/0109196 A1 | 5/2011 | Goto |
| 2011/0199163 A1 | 8/2011 | Yamanaka |
| 2011/0278993 A1 | 11/2011 | Iwamoto |
| 2012/0326809 A1 * | 12/2012 | Tsuda ................ H03H 9/14573 310/313 C |
| 2013/0015353 A1 | 1/2013 | Tai et al. |
| 2013/0021116 A1 | 1/2013 | Sogoya et al. |
| 2013/0057360 A1 | 3/2013 | Meltaus et al. |
| 2013/0321100 A1 | 12/2013 | Wang |
| 2014/0001919 A1 | 1/2014 | Komatsu |
| 2014/0009032 A1 | 1/2014 | Takahashi et al. |
| 2014/0113571 A1 | 4/2014 | Fujiwara |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0218129 A1 | 8/2014 | Fujiwara |
| 2014/0225684 A1 | 8/2014 | Kando et al. |
| 2014/0312994 A1 | 10/2014 | Meltaus et al. |
| 2015/0070227 A1 | 3/2015 | Kishino et al. |
| 2015/0319537 A1 | 11/2015 | Perois et al. |
| 2015/0333730 A1 | 11/2015 | Meltaus |
| 2015/0365067 A1 * | 12/2015 | Hori ................... H03H 9/02228 310/313 A |
| 2016/0028367 A1 | 1/2016 | Shealy |
| 2016/0049920 A1 | 2/2016 | Kishino |
| 2016/0087187 A1 * | 3/2016 | Burak .................... H03H 9/173 310/366 |
| 2016/0182009 A1 | 6/2016 | Bhattacharjee |
| 2016/0285430 A1 | 9/2016 | Kikuchi et al. |
| 2017/0005638 A1 | 1/2017 | Otagawa et al. |
| 2017/0063332 A1 | 3/2017 | Gilbert et al. |
| 2017/0077902 A1 | 3/2017 | Daimon |
| 2017/0104470 A1 | 4/2017 | Koelle et al. |
| 2017/0170808 A1 | 6/2017 | Iwaki et al. |
| 2017/0179928 A1 | 6/2017 | Raihn et al. |
| 2017/0187352 A1 | 6/2017 | Omura |
| 2017/0214387 A1 | 7/2017 | Burak et al. |
| 2017/0222618 A1 | 8/2017 | Inoue et al. |
| 2017/0222622 A1 | 8/2017 | Solal et al. |
| 2017/0264263 A1 | 9/2017 | Huang et al. |
| 2017/0324394 A1 | 11/2017 | Ebner et al. |
| 2017/0359050 A1 | 12/2017 | Irieda et al. |
| 2017/0370791 A1 | 12/2017 | Nakamura et al. |
| 2018/0062604 A1 | 3/2018 | Koskela et al. |
| 2018/0123016 A1 | 5/2018 | Gong et al. |
| 2018/0152169 A1 | 5/2018 | Goto et al. |
| 2018/0191322 A1 | 7/2018 | Chang et al. |
| 2019/0068164 A1 | 2/2019 | Houlden et al. |
| 2019/0123721 A1 | 4/2019 | Takamine |
| 2019/0131953 A1 | 5/2019 | Gong |
| 2019/0148621 A1 | 5/2019 | Feldman et al. |
| 2019/0181833 A1 | 6/2019 | Nosaka |
| 2019/0245518 A1 | 8/2019 | Ito |
| 2019/0273480 A1 | 9/2019 | Lin |
| 2019/0273481 A1 | 9/2019 | Michigami |
| 2019/0386635 A1 | 12/2019 | Plesski et al. |
| 2019/0386637 A1 | 12/2019 | Plesski et al. |
| 2019/0386638 A1 | 12/2019 | Kimura et al. |
| 2020/0007110 A1 | 1/2020 | Konaka et al. |
| 2020/0021271 A1 | 1/2020 | Plesski et al. |

(56) References Cited

U.S. PATENT DOCUMENTS

| | | |
|---|---|---|
| 2020/0091893 A1 | 3/2020 | Plesski et al. |
| 2020/0162052 A1 | 5/2020 | Matsuoka et al. |
| 2020/0220522 A1 | 7/2020 | Nosaka |
| 2020/0228087 A1 | 7/2020 | Michigami et al. |
| 2020/0304091 A1 | 9/2020 | Yantchev |
| 2020/0328728 A1 | 10/2020 | Nakagawa et al. |
| 2020/0336130 A1 | 10/2020 | Turner |
| 2020/0373907 A1 | 11/2020 | Garcia |
| 2021/0006228 A1 | 1/2021 | Garcia |
| 2021/0013859 A1 | 1/2021 | Turner et al. |
| 2021/0013868 A1 | 1/2021 | Plesski |
| 2021/0036679 A1* | 2/2021 | Kishino ............ H03H 9/02157 |
| 2021/0126619 A1 | 4/2021 | Wang et al. |
| 2021/0273631 A1 | 9/2021 | Jachowski et al. |
| 2021/0384885 A1 | 12/2021 | Daimon et al. |
| 2022/0103160 A1 | 3/2022 | Jachowski |
| 2022/0216842 A1 | 7/2022 | Nagatomo et al. |
| 2022/0231661 A1 | 7/2022 | McHugh |

FOREIGN PATENT DOCUMENTS

| | | |
|---|---|---|
| CN | 112352382 A | 2/2021 |
| DE | 112011100580 T5 | 1/2013 |
| JP | H0522074 A | 1/1993 |
| JP | H10209804 A | 8/1998 |
| JP | 2001244785 A | 9/2001 |
| JP | 2002300003 A | 10/2002 |
| JP | 2003078369 A | 3/2003 |
| JP | 2004096677 A | 3/2004 |
| JP | 2004129222 A | 4/2004 |
| JP | 2004304622 A | 10/2004 |
| JP | 2006173557 A | 6/2006 |
| JP | 2007251910 A | 9/2007 |
| JP | 2010103803 A | 5/2010 |
| JP | 2010109949 A | 5/2010 |
| JP | 2010233210 A | 10/2010 |
| JP | 2013528996 A | 7/2013 |
| JP | 2015054986 A | 3/2015 |
| JP | 2016001923 A | 1/2016 |
| JP | 2017220910 A | 12/2017 |
| JP | 2018166259 A | 10/2018 |
| JP | 2018207144 A | 12/2018 |
| JP | 2019186655 A | 10/2019 |
| JP | 2020088459 A | 6/2020 |
| JP | 2020113939 A | 7/2020 |
| WO | 2010047114 A1 | 4/2010 |
| WO | 2013021948 A1 | 2/2013 |
| WO | 2015098694 A1 | 7/2015 |
| WO | 2015156232 A1 | 10/2015 |
| WO | 2015182521 A1 | 12/2015 |
| WO | 2016017104 A1 | 2/2016 |
| WO | 2016052129 A1 | 4/2016 |
| WO | 2016147687 A1 | 9/2016 |
| WO | 2018003273 A1 | 1/2018 |
| WO | 2018079522 A1 | 5/2018 |
| WO | 2018163860 A1 | 9/2018 |
| WO | 2019138810 A1 | 7/2019 |
| WO | 2019241174 A1 | 12/2019 |
| WO | 2020092414 A2 | 5/2020 |
| WO | 2020175234 A1 | 9/2020 |
| WO | 2021060523 A1 | 4/2021 |
| WO | 2023002858 A1 | 1/2023 |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 Ghz Lithium Niobate MEMS Resonators With High FOM Of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A.. (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Y-cut X-propagation LiNbO3 plates." Electron. Comm. Jpn. Pt. I, 69, No. 4 (1986): 47-55. doi:10.1002/ecja.4410690406.

Naumenko et al., "Optimal orientations of Lithium Niobate for resonator SAW filters", 2003 IEEE Ultrasonics Symposium—pp. 2110-2113. (Year: 2003).

Webster Dictionary Meaning of "diaphragm" Merriam Webster since 1828.

Safari et al. "Piezoelectric for Transducer Applications" published by Elsevier Science Ltd., pp. 4 (Year: 2000).

Moussa et al. Review on Triggered Liposomal Drug Delivery with a Focus on Ultrasound 2015, Bentham Science Publishers, pp. 16 (Year 2005).

"Acoustic Properties of Solids" ONDA Corporation, 592 Weddell Drive, Sunnyvale, CA 94089, Apr. 11, 2003, pp. 5 (Year 2003).

Bahreynl, B., "Fabrication and Design of Resonant Microdevices" Andrew William, Inc. 2018, NY (Year 2008).

Material Properties of Tibtech Innovations, @ 2018 TIBTECH Innovations (Year 2018).

Bousquet, Marie e al. "Single-mode high frequency LiNbO3 Film Bulk Acoustic Resonator," 2019 IEEE International Ultrasonics Symposium (IUS), Glasgow, Scotland, Oct. 6-9, 2019, pp. 84-87.

Wikipedia contributors, "Quartz crystal microbalance," Wikipedia, The Free Encyclopedia, https://en.wikipedia.org/w/index.php?title=Quartz_crystal_microbalance&oldid=1009990186 (accessed Apr. 9, 2021).

Yantchev, Ventsislav & Katardjiev, Ilia. (2013). Thin film Lamb wave resonators in frequency control and sensing applications: A review. Journal of Micromechanics and Microengineering. 23. 043001. 10.1088/0960-1317/23/4/043001.

Wei Pang et al. "Analytical and experimental study on the second harmonic mode response of a bulk acoustic wave resonator" 2010 J. Micromech. Microeng. 20 115015; doi: 10.1088/0960-1317/20/11/115015.

Durmus et al. "Acoustic-Based Biosensors" Encyclopedia of Microfluidics and Nanofluidics. DOI 10.1007/978-3-642-27758-0_10-2 Springer Science+Business Media New York 2014.

USPTO/ISA, International Search Report and Written Opinion for PCT Application No. PCT/US2023/017732 dated Jul. 27, 2023.

USPTO/ISA, International Search Report and Written Opinion for PCT Application No. PCT/US2022/082421 dated May 3, 2023.

USPTO/ISA, International Search Report and Written Opinion for PCT Application No. PCT/US2022/081095 dated May 30, 2023.

USPTO/ISA, International Search Report and Written Opinion for PCT Application No. PCT/US2022/079236 dated Mar. 10, 2023.

USPTO/ISA, International Search Report and Written Opinion for PCT Application No. PCT/US2022/081068 dated Apr. 18, 2023.

USPTO/ISA, International Search Report and Written Opinion for PCT Application No. PCT/US2022/080246 dated Mar. 30, 2023.

Gong et al.,"Design and Analysis of Lithium-Niobate-Based High Electromechanical Coupling RF-MEMS Resonators for Wideband Filtering", IEEE Transactions on Microwave Theory and Techniques, vol. 61, No. 1, Jan. 2013, pp. 403-413.

* cited by examiner

DECOUPLED TRANSVERSELY-EXCITED FILM BULK ACOUSTIC RESONATORS

CROSS REFERENCE TO RELATED APPLICATION INFORMATION

This patent application is a continuation of U.S. patent application Ser. No. 17/547,113, filed Dec. 9, 2021, which is a continuation of U.S. patent application Ser. No. 17/408,120, filed Aug. 20, 2021, issued as U.S. Pat. No. 11,239,816, which claims priority to U.S. Provisional Patent Application No. 63/137,736, filed Jan. 15, 2021, entitled XBAR WITH INSULATING LAYER BETWEEN ELECTRODE AND PIEZOELECTRIC MEMBRANE TO REDUCE ACOUSTIC COUPLING, the entire contents of each application are incorporated herein by reference.

TECHNICAL FIELD

This disclosure relates to radio frequency filters using acoustic wave resonators, and specifically to filters for use in communications equipment.

BACKGROUND

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation (5G) mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
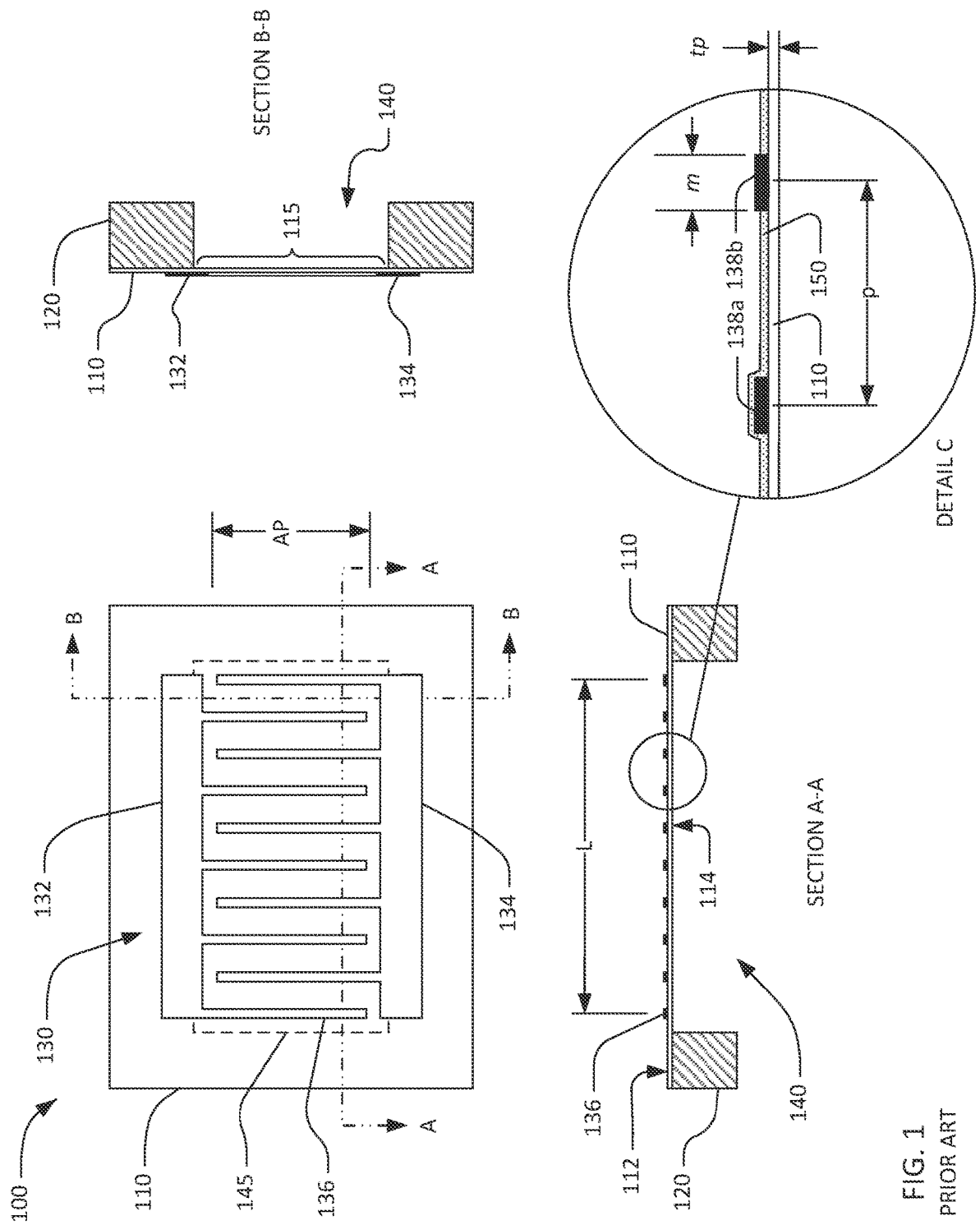
FIG. 1 includes a schematic plan view, two schematic cross-sectional views, and a detail view of a transversely-excited film bulk acoustic resonator (XBAR).

FIG. 1 shows a simplified schematic top view and orthogonal cross-sectional views of an XBAR 100. XBAR-type resonators such as the XBAR 100 may be used in a variety of RF filters including band-reject filters, band-pass filters, duplexers, and multiplexers.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. The piezoelectric plate may be Z-cut, which is to say the Z axis is normal to the front and back surfaces 112, 114. The piezoelectric plate may be rotated Z-cut or rotated YX-cut. XBARs may be fabricated on piezoelectric plates with other crystallographic orientations.

The back surface 114 of the piezoelectric plate 110 is attached to a surface of a substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item". In other configurations, the diaphragm 115 may be contiguous with the piezoelectric plate around at least 50% of the perimeter 145 of the cavity 140.

The substrate 120 provides mechanical support to the piezoelectric plate 110. The substrate 120 may be, for example, silicon, sapphire, quartz, or some other material or combination of materials. The back surface 114 of the piezoelectric plate 110 may be attached to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers (not shown in FIG. 1).

"Cavity" has its conventional meaning of "an empty space within a solid body." The cavity 140 may be a hole completely through the substrate 120 (as shown in Section A-A and Section B-B) or a recess in the substrate 120 under the diaphragm 115. The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The term "busbar" means a conductor from which the fingers of an IDT extend. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. The primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 that spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

For ease of presentation in FIG. 1, the geometric pitch and width of the IDT fingers are greatly exaggerated with respect to the length (dimension L) and aperture (dimension AP) of the XBAR. A typical XBAR has more than ten parallel fingers in the IDT 130. An XBAR may have hundreds, possibly thousands, of parallel fingers in the IDT 130. Similarly, the thicknesses of the IDT fingers and the piezoelectric plate in the cross-sectional views are greatly exaggerated.

Referring now to the detailed schematic cross-sectional view (Detail C), a front-side dielectric layer 150 may optionally be formed on the front side of the piezoelectric plate 110. The "front side" of the XBAR is, by definition, the surface facing away from the substrate. The front-side dielectric layer 150 may be formed only between the IDT fingers (e.g. IDT finger 138*b*) or may be deposited as a blanket layer such that the dielectric layer is formed both between and over the IDT fingers (e.g. IDT finger 138*a*). The front-side dielectric layer 150 may be a non-piezoelectric dielectric material, such as silicon dioxide, alumina, or silicon nitride. A thickness of the front side dielectric layer 150 is typically less than about one-third of the thickness tp of the piezoelectric plate 110. The front-side dielectric layer 150 may be formed of multiple layers of two or more materials. In some applications, a back-side dielectric layer (not shown) may be formed on the back side of the piezoelectric plate 110.

The IDT fingers 138*a*, 138*b* may be one or more layers of aluminum, an aluminum alloy, copper, a copper alloy, beryllium, gold, tungsten, molybdenum, chromium, titanium or some other conductive material. The IDT fingers are considered to be "substantially aluminum" if they are formed from aluminum or an alloy comprising at least 50% aluminum. The IDT fingers are considered to be "substantially copper" if they are formed from copper or an alloy comprising at least 50% copper. Thin (relative to the total thickness of the conductors) layers of metals such as chromium or titanium may be formed under and/or over and/or as layers within the fingers to improve adhesion between the fingers and the piezoelectric plate 110 and/or to passivate or encapsulate the fingers and/or to improve power handling. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension m is the width or "mark" of the IDT fingers. The geometry of the IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT may be 2 to 20 times the width m of the fingers. The pitch p is typically 3.3 to 5 times the width m of the fingers. In addition, the pitch p of the IDT may be 2 to 20 times the thickness of the piezoelectric plate 210. The pitch p of the IDT is typically 5 to 12.5 times the thickness of the piezoelectric plate 210. The width m of the IDT fingers in an XBAR is not constrained to be near one-fourth of the acoustic wavelength at resonance. For example, the width of XBAR IDT fingers may be 500 nm or greater, such that the IDT can be readily fabricated using optical lithography. The thickness of the IDT fingers may be from 100 nm to about equal to the width m. The thickness of the busbars (132, 134) of the IDT may be the same as, or greater than, the thickness of the IDT fingers.

Figure 2:
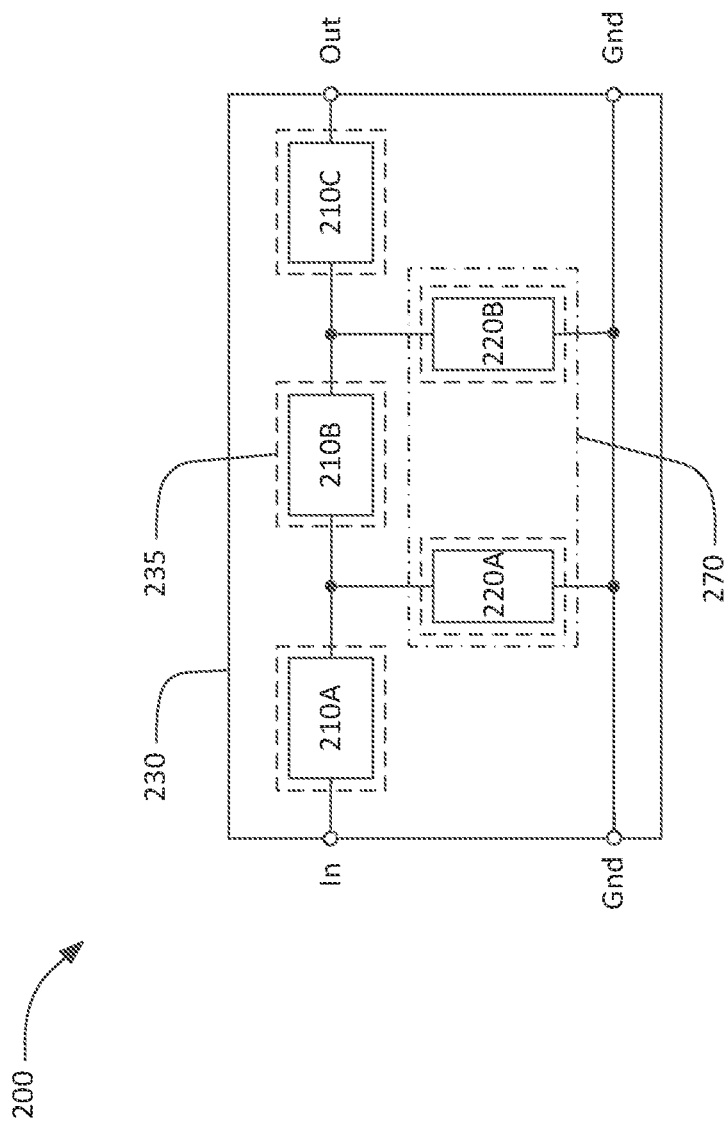
FIG. 2 is a schematic block diagram of a band-pass filter using acoustic resonators.

FIG. 2 is a schematic circuit diagram and layout for a high frequency band-pass filter 200 using XBARs. The filter 200 has a conventional ladder filter architecture including three series resonators 210A, 210B, 210C and two shunt resonators 220A, 220B. The three series resonators 210A, 210B, and 210C are connected in series between a first port and a second port (hence the term "series resonator"). In FIG. 2, the first and second ports are labeled "In" and "Out", respectively. However, the filter 200 is bidirectional and either port may serve as the input or output of the filter. The two shunt resonators 220A, 220B are connected from nodes between the series resonators to ground. A filter may contain additional reactive components, such as capacitors and/or inductors, not shown in FIG. 2. All the shunt resonators and series resonators are XBARs. The inclusion of three series and two shunt resonators is exemplary. A filter may have more or fewer than five total resonators, more or fewer than three series resonators, and more or fewer than two shunt resonators. Typically, all of the series resonators are connected in series between an input and an output of the filter. All of the shunt resonators are typically connected between ground and one of the input, the output, or a node between two series resonators.

In the exemplary filter 200, the three series resonators 210A, B, C and the two shunt resonators 220A, B of the filter 200 are formed on a single plate 230 of piezoelectric material bonded to a silicon substrate (not visible). In some filters, the series resonators and shunt resonators may be formed on different plates of piezoelectric material. Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 2, the cavities are illustrated schematically as the dashed rectangles (such as the rectangle 235). In this example, each IDT is disposed over a respective cavity. In other filters, the IDTs of two or more resonators may be disposed over a single cavity.

Each of the resonators 210A, 210B, 210C, 220A, 220B in the filter 200 has resonance where the admittance of the resonator is very high and an anti-resonance where the admittance of the resonator is very low. The resonance and anti-resonance occur at a resonance frequency and an anti-resonance frequency, respectively, which may be the same or different for the various resonators in the filter 200. In over-simplified terms, each resonator can be considered a short-circuit at its resonance frequency and an open circuit at its anti-resonance frequency. The input-output transfer function will be near zero at the resonance frequencies of the shunt resonators and at the anti-resonance frequencies of the series resonators. In a typical filter, the resonance frequencies of the shunt resonators are positioned below the lower edge of the filter's passband and the anti-resonance frequencies of the series resonators are positioned above the upper edge of the passband. In some filters, a front-side dielectric layer (also called a "frequency setting layer"), represented by the dot-dash rectangle 270, may be formed on the shunt resonators to set the resonance frequencies of the shunt resonators lower relative to the resonance frequencies of the series resonators. In other filters, the diaphragms of series resonators may be thinner than the diaphragms of shunt resonators. In some filters, the series resonators and the shunt resonators may be fabricated on separate chips having different piezoelectric plate thicknesses.

Lithium niobate (LN) is a preferred piezoelectric material for use in XBARs. LN has very high electromechanical coupling and is available as thin plates attached to non-piezoelectric substrates. While a wide variety of crystal orientations can be used in an XBAR, two orientations that have been used are Z-cut (Euler angles 0°, 0°, 90°) and rotated Y-cut (Euler angles 0°, β, 0° where 0°<β≤70°). Rotated Y-cut LN with 30°≤β≤38° has higher electromechanical coupling than Z-cut LN. Further, while both Z cut and rotated Y-cut LN XBARs are susceptible to leakage of acoustic energy in the transverse direction (the direction parallel to the IDT fingers), comparatively simple structures can be used to minimize such losses in a rotated Y-cut LN XBAR. Minimizing acoustic losses in a Z-cut LN XBAR requires a more complex structure that necessitates additional fabrication steps. XBARs using rotated Y-cut LN may have fewer and smaller spurious modes than Z-cut LN XBARs.

Figure 3:
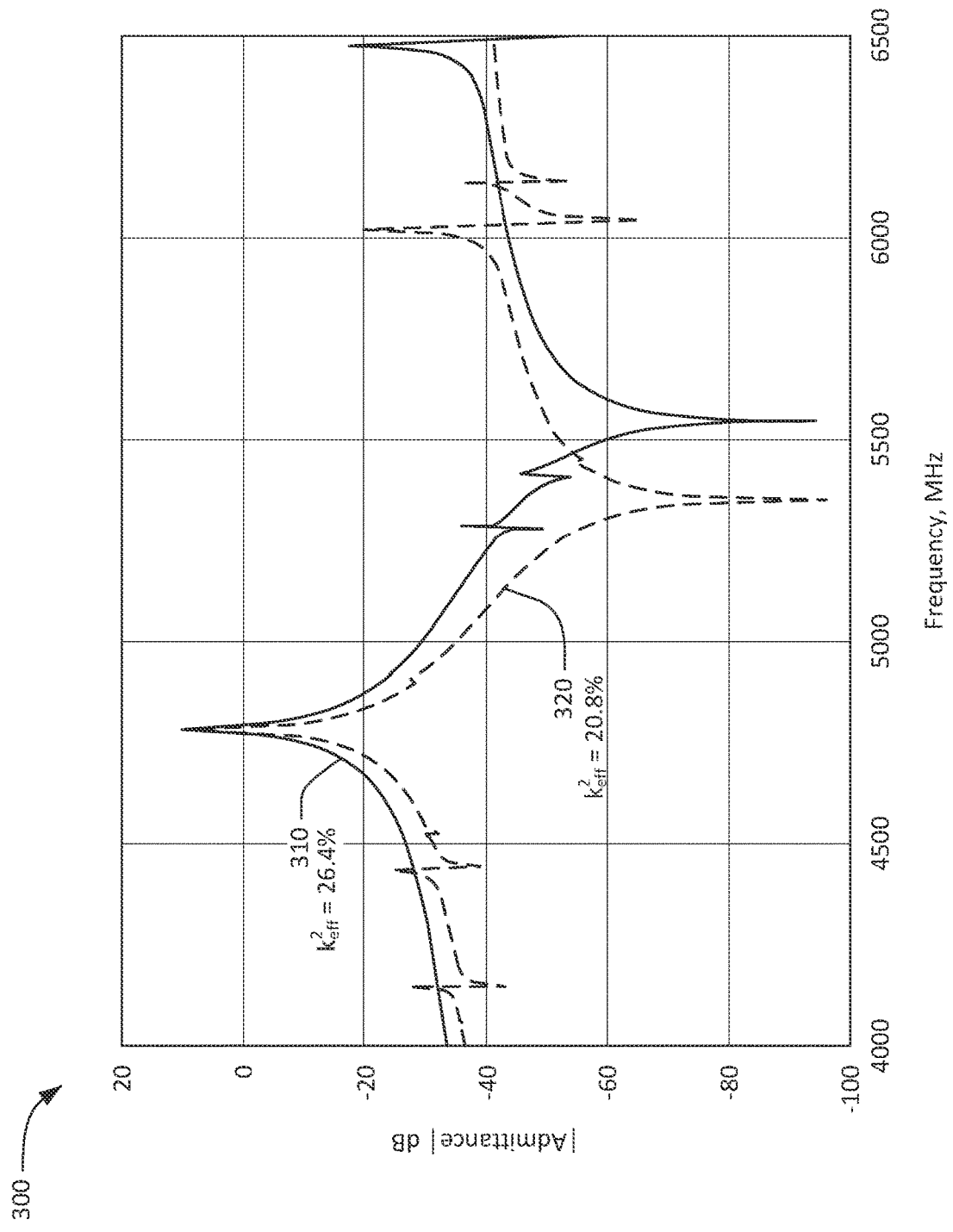
FIG. 3 is a graph of the magnitude of admittance for XBARs using YX-cut lithium niobate and Z-cut lithium niobate diaphragms.

FIG. 3 is a graph 300 of the magnitude of admittance for two XBARs. The data shown in FIG. 3 and all subsequent examples results from simulation of the XBARs using a finite element method. Solid curve 310 is the admittance of an XBAR using a rotated Y-cut LN piezoelectric plate with β=30°. The dashed curve 320 is the admittance of an XBAR using a Z-cut LN piezoelectric plate. In both cases, the piezoelectric plate thickness is 400 nm, the IDT electrodes are aluminum, the IDT pitch is 3 microns and the IDT finger mark is 0.5 microns. The resonance frequency FR of both XBARs is about 4760 MHz and the anti-resonance frequencies FA of the rotated Y-cut and Z-cut XBARs are about 5550 MHz and 5350 MHz, respectively. The difference between the resonance and anti-resonance frequencies of the rotated Y-cut and Z-cut XBARs are about 590 MHz and 790 MHz, respectively. The electromechanical coupling may be quantified by a parameter $k^2_{eff}$, where $k^2_{eff} = (FA^2 - FR^2)/$ $FA^2 \cdot k^2_{eff}$ of the rotated Y-cut and Z-cut XBARs of FIG. 3 are 26.4% and 20.8%, respectively.

The large difference between the resonance and anti-resonance frequencies of rotated Y-cut LN XBARs enables the design of filters with very wide bandwidth. However, the difference between the resonance and anti-resonance frequencies can be too high for some filter applications. For example, 5G NR band N79 spans a frequency range from 4400 MHz to 5000 MHz. A band N79 bandpass filter cannot be implemented with conventional rotated Y-cut LN XBARs. As previously described, the resonance frequencies of shunt resonators in a ladder filter circuit are typically just below the lower edge of the filter passband and the anti-resonance frequencies of shunt resonators are within the passband. Conversely, the anti-resonance frequencies of series resonators are typically just above the upper edge of the filter passband and the resonance frequencies of series resonators are within the passband. To achieve these two requirements, the difference between the resonance and anti-resonance frequencies of the resonators needs to be less than or equal to the filter bandwidth. The difference between the resonance and anti-resonance frequencies of a rotated Y-cut LN XBAR is 790 MHz, which is greater than the 600 MHz bandwidth of band N79.

Figure 4:
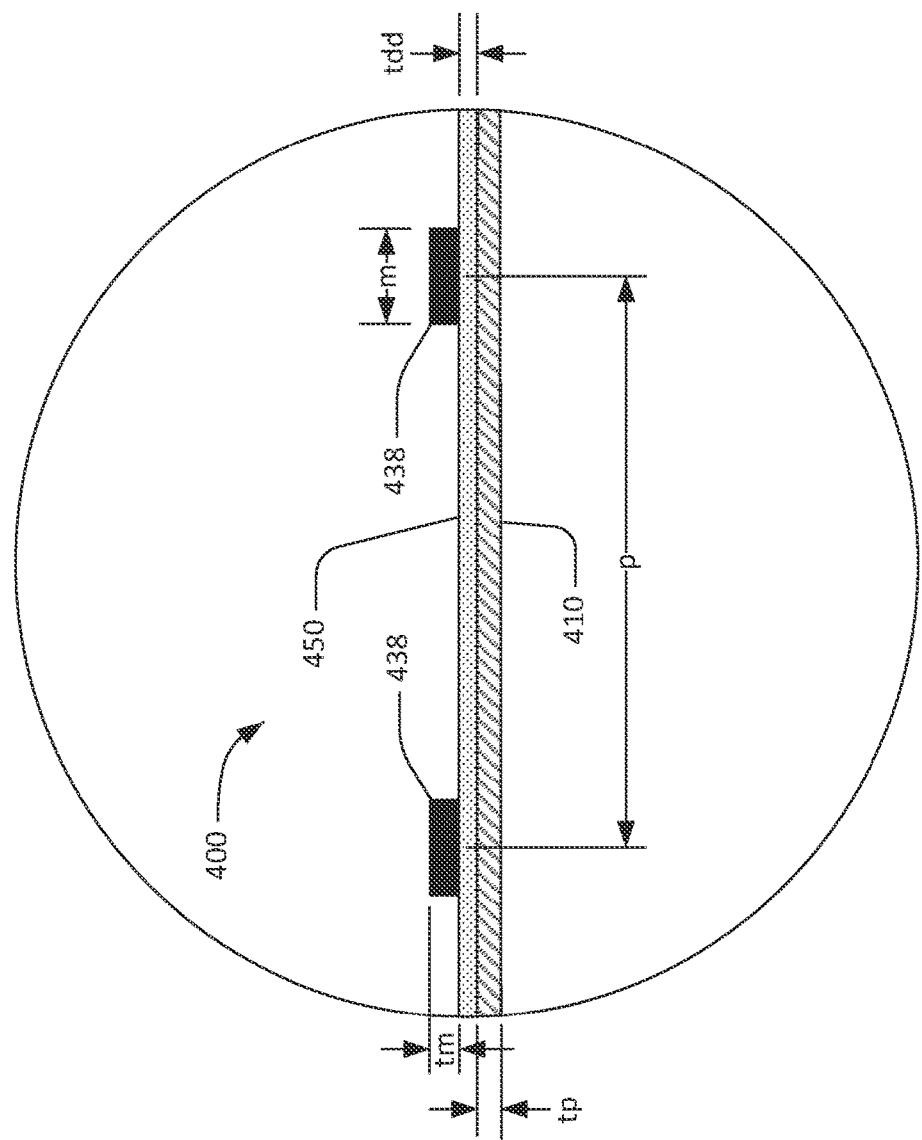
FIG. 4 is a schematic cross-sectional view of an XBAR with a decoupling dielectric layer between the IDT fingers and the piezoelectric diaphragm.

FIG. 4 is a detailed cross-sectional schematic view of a "decoupled" XBAR resonator (DXBAR) 400. The decoupled XBAR 400 includes a piezoelectric plate 410 having a thickness tp and IDT fingers 438 having a thickness tm, pitch p, and width m. The materials of the piezoelectric plate 410 and the IDT fingers 438 may be as previously described.

The difference between the decoupled XBAR 400 and the XBAR 100 shown in Detail C of FIG. 1, is the presence of a dielectric layer 450 between the IDT fingers 438 and the diaphragm 410. The effect of the dielectric layer 450 is to "decouple" the XBAR 400, which is to say reduce the electromechanical coupling of the XBAR 400. A dielectric layer such as the dielectric layer 450 will be referred to herein as a "decoupling dielectric layer". The degree of decoupling depends, in part, on a thickness tdd of the decoupling dielectric layer 450.

The decoupling dielectric layer 450 may be made of, for example, silicon dioxide, silicon nitride, aluminum oxide, or some other suitable dielectric material. In some applications, a preferred material for the decoupling dielectric layer 450 may be silicon dioxide, which provides an important secondary benefit of lowering the temperature coefficient of frequency (TCF) of the XBAR 400 compared to the XBAR 100 of FIG. 1.

Although not shown in FIG. 4, one or more additional dielectric layers, such as the dielectric layer 150 in FIG. 1, may be formed over the IDT fingers 438 and the decoupling dielectric layer 450. The additional dielectric layers may include a frequency setting layer, typically formed over the IDTs of shunt resonators in a ladder filter circuit to lower their resonant frequency relative to the resonance frequencies of series resonators. The additional dielectric layers may also be or include a passivation and tuning layer that seals the surface of the device and provides sacrificial material that can be selectively removed to tune the resonance frequency.

Figure 5:
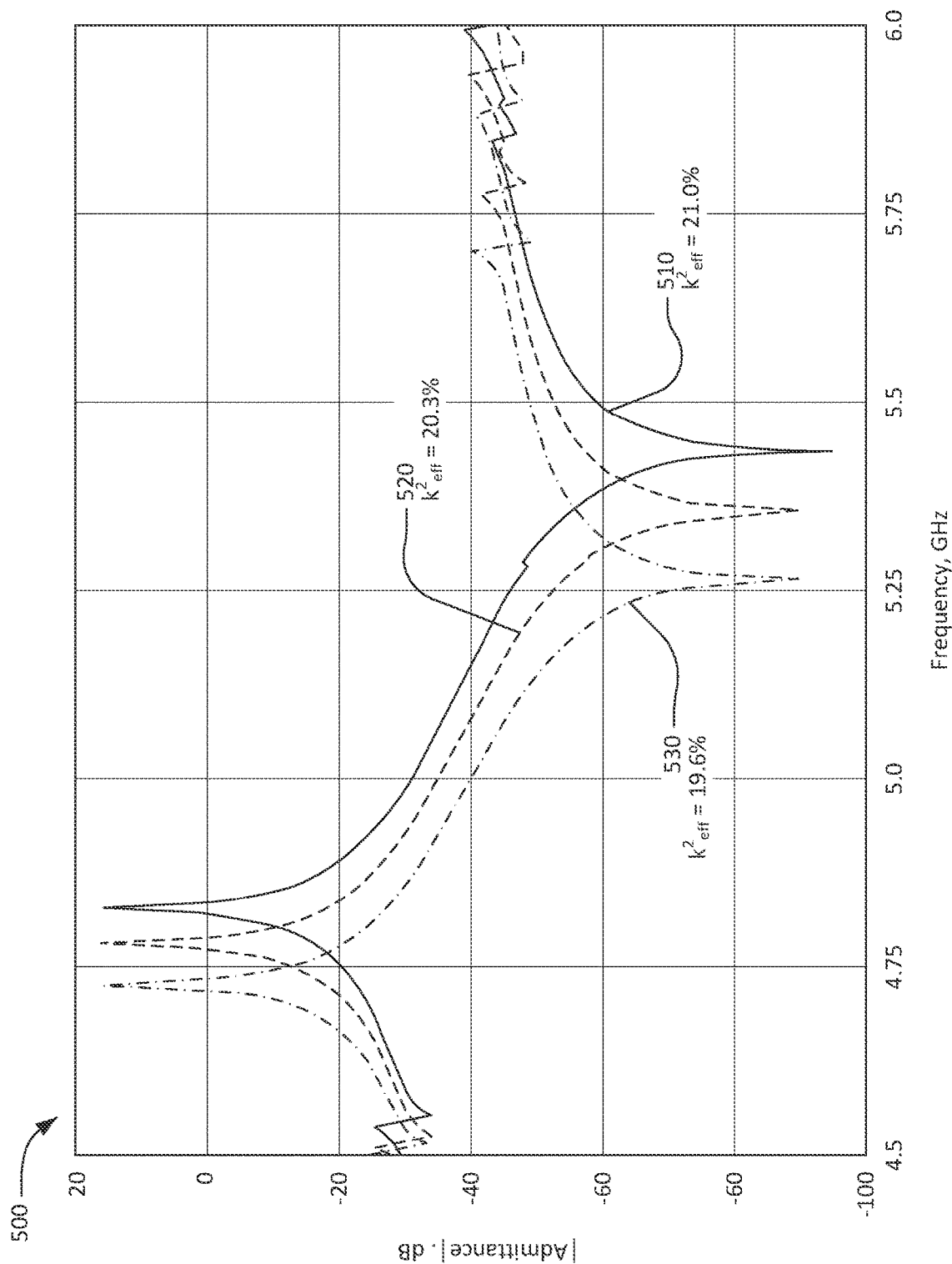
FIG. 5 is a graph of the magnitude of admittance for XBARs with decoupling dielectric layers with different thicknesses.

FIG. 5 is a graph 500 of the magnitude of admittance as a function of frequency for three decoupled XBAR devices. The solid curve 510 is a plot of the magnitude of admittance of a decoupled XBAR with tdd (the thickness of the decoupling dielectric layer)=70 nm. The dashed curve 520 is a plot of the magnitude of admittance of a decoupled XBAR with tdd=80 nm. The dot-dash curve 530 is a plot of the magnitude of admittance of a decoupled XBAR with tdd=90 nm. All three XBARs use rotated Y-cut piezoelectric plates with Euler angles 0°, 30°, 0°.

Increasing the thickness of the decoupling dielectric layer increases the overall thickness of the XBAR diaphragm which results in a corresponding reduction in resonance frequency. Increasing the thickness of the decoupling dielectric layer lowers the electromechanical coupling which reduces the difference between the resonance and anti-resonance frequencies. The values of $k^2_{eff}$ for the three XBARs are 21%, 20%, and 19%. The $k^2_{eff}$ of the XBAR with tdd=80 nm (dashed curve 520) is approximately the same as an XBAR using a Z-cut piezoelectric plate.

Figure 6:
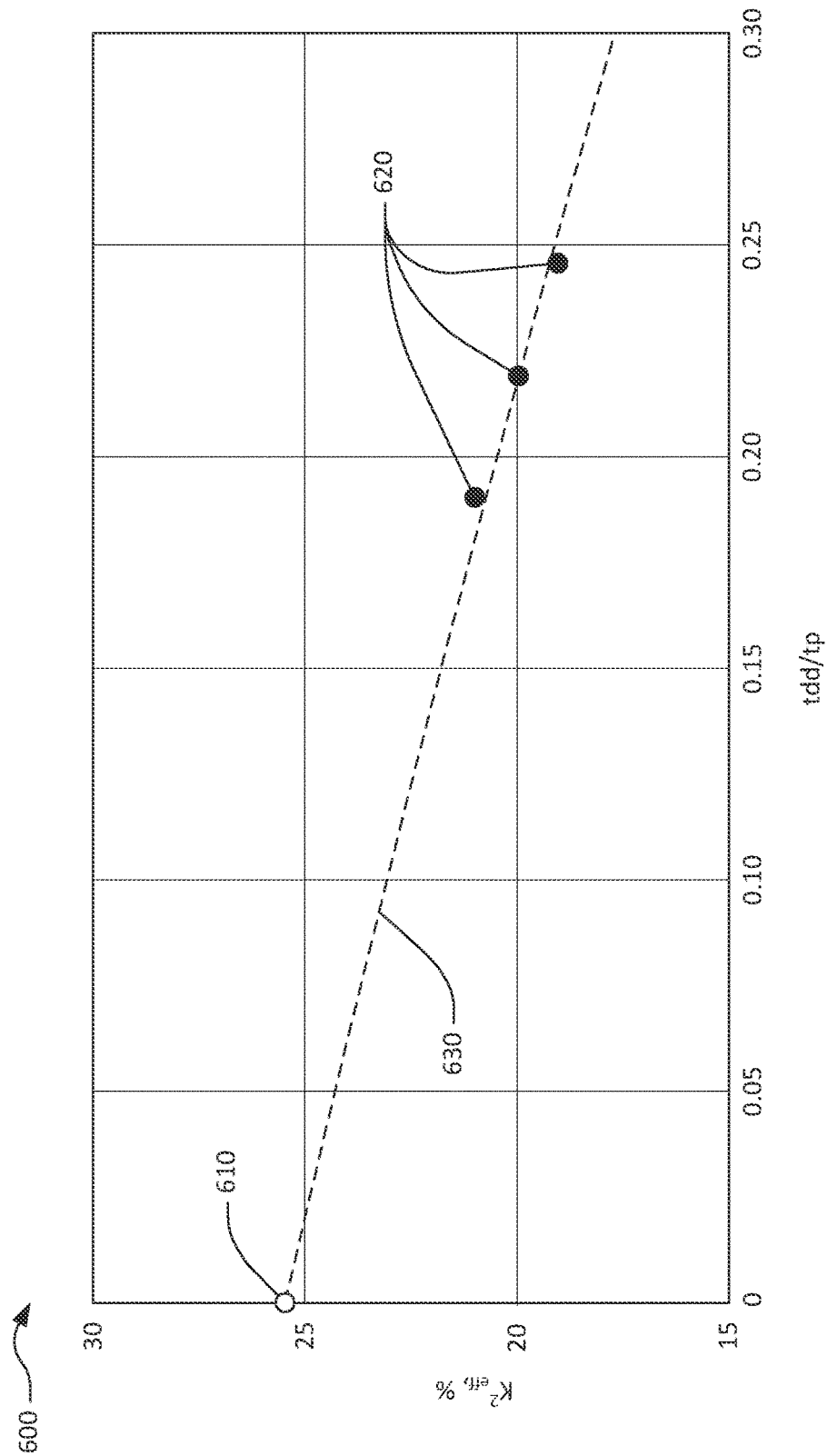
FIG. 6 is a graph of electromechanical coupling as a function of decoupling dielectric layer thickness.

The effect of a decoupling dielectric layer will scale with the thickness of the piezoelectric plate. FIG. 6 is a graph 600 of $k^2_{eff}$ as a function of the ratio of tdd (thickness of the decoupling dielectric layer) to tp (thickness of the piezoelectric plate) for XBARs using rotated Y-cut lithium niobate with Euler angles 0°, 37.5°, 0°. The open circle 610 represents the LN XBAR of FIG. 3 and the filled circles 620 represent the three XBARs of FIG. 5. The dashed line 630 is a reasonable linear approximation to the data points over this range of tdd/tp.

The ratio tdd/tp will typically be greater than or equal to 0.05 to obtain a useful reduction in $k^2_{eff}$. The ratio tdd/tp will generally not be greater than 0.5.

Figure 7:
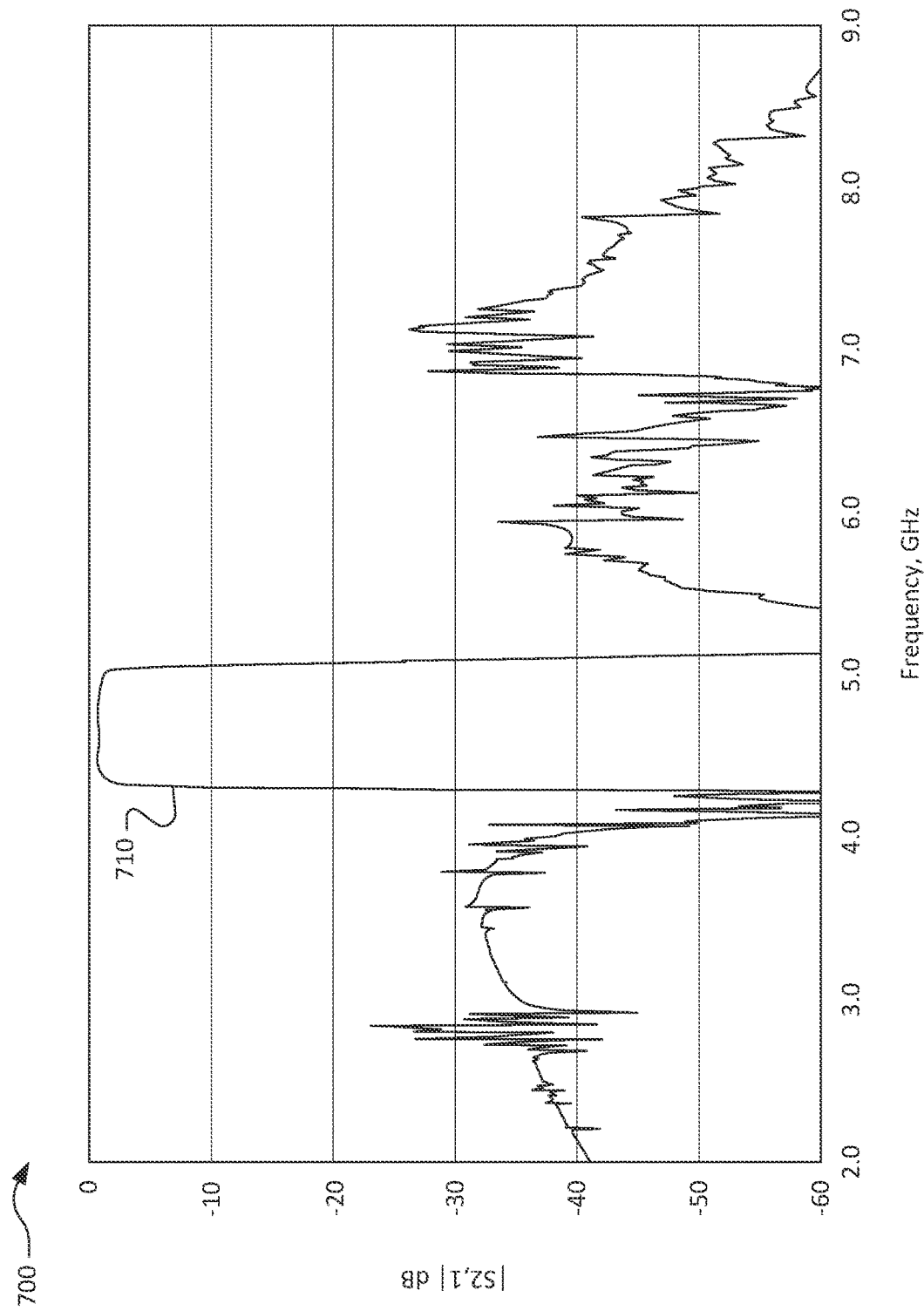
FIG. 7 is a graph of the input-output transfer function of a band N79 filter using decoupled XBARs.

FIG. 7 is a graph 700 of the performance of a preliminary band N79 bandpass filter design using decoupled XBARs. Specifically, the curve 710 is a plot of the magnitude of S2,1 (the input-output transfer function) of the filter versus frequency. The simulated filter incorporates seven decoupled XBARs in a ladder filter circuit. The piezoelectric plate is rotated Y-cut lithium niobate. The thickness of the decoupling dielectric layer is about 22% of the thickness of the piezoelectric plate. A frequency setting dielectric layer is formed over the shunt resonators and a passivation dielectric layer is formed over all of the resonators.

The frequency of an XBAR or DXBAR is primarily determined by the thickness of its diaphragm, including the piezoelectric plate and any dielectric layers. The mark and pitch of the IDT of an XBAR are selected to minimize the effects of spurious modes and, in particular, to locate spurious modes at frequencies removed from the passband of a filter. The length and aperture of an XBAR or DXBAR is determined by a combination of the capacitance required to match desired filter input and output impedances and the anticipate power dissipation in the device.

For a given IDT pitch and mark, the capacitance per unit IDT area of a DXBAR will be less than the capacitance per unit area of an XBAR. The reduction in capacitance is due to the presence of the decoupling dielectric layer, which has a significantly lower dielectric constant than the piezoelectric plate. However, the mark/pitch design space (for low spurious modes) for DXBARs tends to favor smaller pitch values. Smaller pitch results in larger capacitance per unit area, which offsets the reduced capacitance due to the presence of the decoupling dielectric layer. Thus, filters using DXBARs need not be larger, and may in some cases be smaller, than filters using XBARs.

A secondary, but important benefit of using a silicon dioxide decoupling dielectric layer is an improvement in the temperature coefficient of frequency (TCF). A DXBAR with a decoupling dielectric layer thickness about 22% of the thickness of the piezoelectric plate has a TCF of 65 at the resonance frequency and 62 at the anti-resonance frequency.

A comparable XBAR using Z-cut lithium niobate has a TCF of 105 at the resonance frequency and 83 at the anti-resonance frequency.

The use of a decoupling dielectric layer to reduce the electromechanical coupling of an XBAR provides the filter designer with an additional degree of freedom. The filter designer may tailor the electromechanical coupling to the requirements of a particular filter without requiring a unique cut angle for the piezoelectric plate.

Description of Methods

Figure 8:
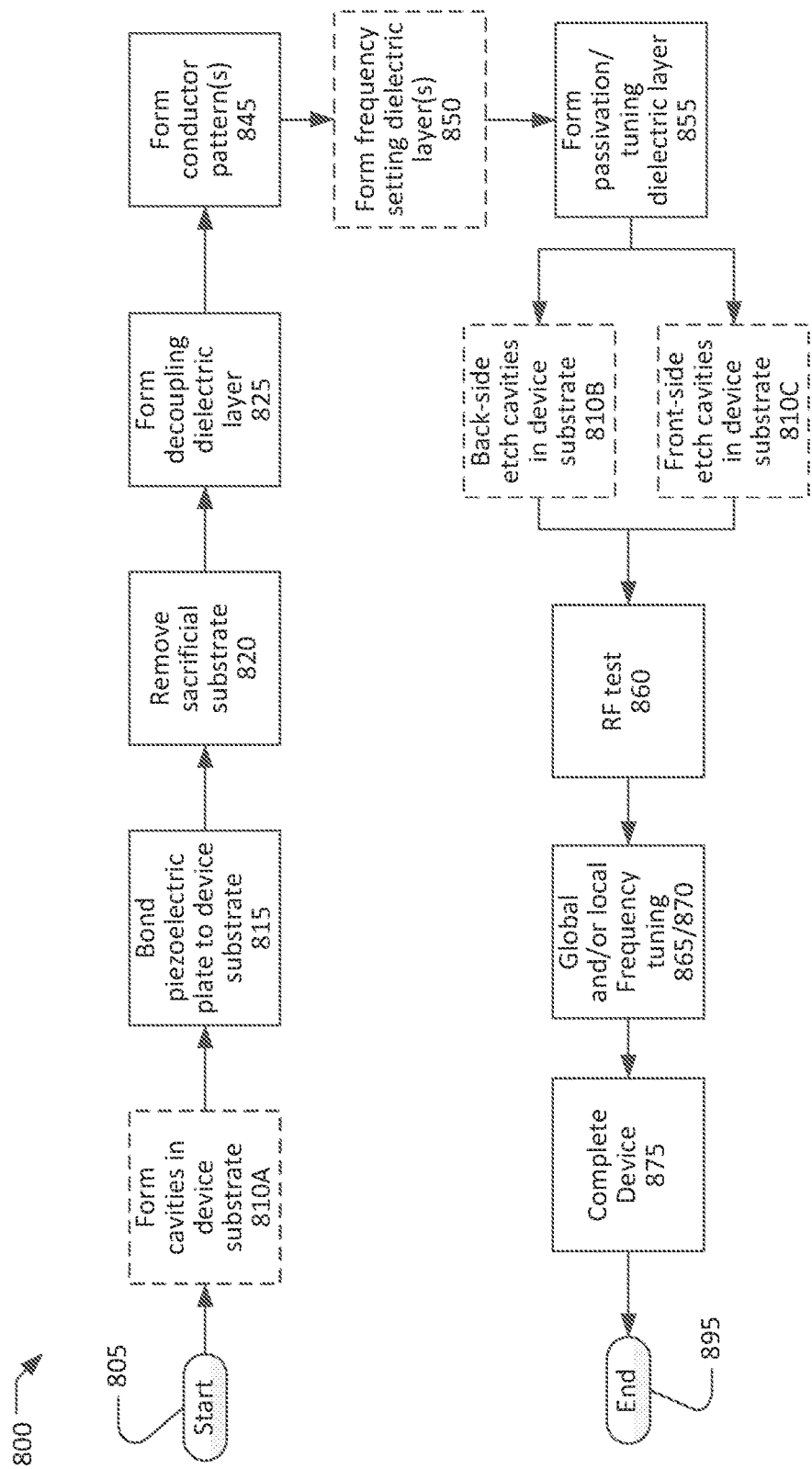
FIG. 8 is a flow chart of a method for fabricating a decoupled XBAR or a filter using decoupled XBARs.

FIG. 8 is a simplified flow chart summarizing a process 800 for fabricating a filter device incorporating DXBARs. Specifically, the process 800 is for fabricating a filter device including multiple DXBARs, some of which may include a frequency setting dielectric layer. The process 800 starts at 805 with a device substrate and a thin plate of piezoelectric material disposed on a sacrificial substrate. The process 800 ends at 895 with a completed filter device. The flow chart of FIG. 8 includes only major process steps. Various conventional process steps (e.g. surface preparation, cleaning, inspection, baking, annealing, monitoring, testing, etc.) may be performed before, between, after, and during the steps shown in FIG. 8.

While FIG. 8 generally describes a process for fabricating a single filter device, multiple filter devices may be fabricated simultaneously on a common wafer (consisting of a piezoelectric plate bonded to a substrate). In this case, each step of the process 800 may be performed concurrently on all of the filter devices on the wafer.

The flow chart of FIG. 8 captures three variations of the process 800 for making an XBAR which differ in when and how cavities are formed in the device substrate. The cavities may be formed at steps 810A, 810B, or 810C. Only one of these steps is performed in each of the three variations of the process 800.

The piezoelectric plate may typically be rotated Y-cut lithium niobate. The piezoelectric plate may be some other material and/or some other cut. The device substrate may preferably be silicon. The device substrate may be some other material that allows formation of deep cavities by etching or other processing.

In one variation of the process 800, one or more cavities are formed in the device substrate at 810A, before the piezoelectric plate is bonded to the substrate at 815. A separate cavity may be formed for each resonator in a filter device. The one or more cavities may be formed using conventional photolithographic and etching techniques. Typically, the cavities formed at 810A will not penetrate through the device substrate.

At 815, the piezoelectric plate is bonded to the device substrate. The piezoelectric plate and the device substrate may be bonded by a wafer bonding process. Typically, the mating surfaces of the device substrate and the piezoelectric plate are highly polished. One or more layers of intermediate materials, such as an oxide or metal, may be formed or deposited on the mating surface of one or both of the piezoelectric plate and the device substrate. One or both mating surfaces may be activated using, for example, a plasma process. The mating surfaces may then be pressed together with considerable force to establish molecular bonds between the piezoelectric plate and the device substrate or intermediate material layers.

At 820, the sacrificial substrate may be removed. For example, the piezoelectric plate and the sacrificial substrate may be a wafer of piezoelectric material that has been ion implanted to create defects in the crystal structure along a plane that defines a boundary between what will become the piezoelectric plate and the sacrificial substrate. At 820, the wafer may be split along the defect plane, for example by thermal shock, detaching the sacrificial substrate and leaving the piezoelectric plate bonded to the device substrate. The exposed surface of the piezoelectric plate may be polished or processed in some manner after the sacrificial substrate is detached.

Thin plates of single-crystal piezoelectric materials laminated to a non-piezoelectric substrate are commercially available. At the time of this application, both lithium niobate and lithium tantalate plates are available bonded to various substrates including silicon, quartz, and fused silica. Thin plates of other piezoelectric materials may be available now or in the future. The thickness of the piezoelectric plate may be between 300 nm and 1000 nm. When the substrate is silicon, a layer of $SiO_2$ may be disposed between the piezoelectric plate and the substrate. When a commercially available piezoelectric plate/device substrate laminate is used, steps 810A, 815, and 820 of the process 800 are not performed.

At 825, a decoupling dielectric layer is formed by depositing a dielectric material on the front surface of the piezoelectric plate. The decoupling dielectric layer may typically be silicon dioxide but may be another dielectric material such as silicon nitride or aluminum oxide. The decoupling dielectric layer may be a composite of two or more dielectric materials or layers of two or more dielectric materials. The decoupling dielectric layer may be patterned such that the decoupling dielectric layer is present on some portions of the piezoelectric plate and not present on other portions of the piezoelectric plate. The decoupling dielectric layer may be formed as two or more separately-patterned layers such that different thicknesses of decoupling dielectric layer are present on different portions of the piezoelectric plate.

A first conductor pattern, including IDTs and reflector elements of each XBAR, is formed at 845 by depositing and patterning one or more conductor layers on the front side of the piezoelectric plate. All or portions of the first conductor pattern may be over the decoupling dielectric layer formed at 825. The conductor layer may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A second conductor pattern of gold, aluminum, copper or other higher conductivity metal may be formed over portions of the first conductor pattern (for example the IDT bus bars and interconnections between the IDTs).

Each conductor pattern may be formed at 845 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, or other etching techniques.

Alternatively, each conductor pattern may be formed at 845 using a lift-off process. Photoresist may be deposited over the piezoelectric plate. and patterned to define the conductor pattern. The conductor layer and, optionally, one or more other layers may be deposited in sequence over the surface of the piezoelectric plate. The photoresist may then be removed, which removes the excess material, leaving the conductor pattern.

At 850, one or more frequency setting dielectric layer(s) may be formed by depositing one or more layers of dielectric material on the front side of the piezoelectric plate. For example, a dielectric layer may be formed over the shunt resonators to lower the frequencies of the shunt resonators relative to the frequencies of the series resonators. The one or more dielectric layers may be deposited using a conventional deposition technique such as physical vapor deposition, atomic layer deposition, chemical vapor deposition, or some other method. One or more lithography processes (using photomasks) may be used to limit the deposition of the dielectric layers to selected areas of the piezoelectric plate. For example, a mask may be used to limit a dielectric layer to cover only the shunt resonators.

At 855, a passivation/tuning dielectric layer is deposited over the piezoelectric plate and conductor patterns. The passivation/tuning dielectric layer may cover the entire surface of the filter except for pads for electrical connections to circuitry external to the filter. In some instantiations of the process 800, the passivation/tuning dielectric layer may be formed after the cavities in the device substrate are etched at either 810B or 810C.

In a second variation of the process 800, one or more cavities are formed in the back side of the device substrate at 810B. A separate cavity may be formed for each resonator in a filter device. The one or more cavities may be formed using an anisotropic or orientation-dependent dry or wet etch to open holes through the back side of the device substrate to the piezoelectric plate. In this case, the resulting resonator devices will have a cross-section as shown in FIG. 1.

In a third variation of the process 800, one or more cavities in the form of recesses in the device substrate may be formed at 810C by etching the substrate using an etchant introduced through openings in the piezoelectric plate. A separate cavity may be formed for each resonator in a filter device. The one or more cavities formed at 810C will not penetrate through the device substrate.

Ideally, after the cavities are formed at 810B or 810C, most or all of the filter devices on a wafer will meet a set of performance requirements. However, normal process tolerances will result in variations in parameters such as the thicknesses of dielectric layer formed at 850 and 855, variations in the thickness and line widths of conductors and IDT fingers formed at 845, and variations in the thickness of the piezoelectric plate. These variations contribute to deviations of the filter device performance from the set of performance requirements.

To improve the yield of filter devices meeting the performance requirements, frequency tuning may be performed by selectively adjusting the thickness of the passivation/tuning layer deposited over the resonators at 855. The frequency of a filter device passband can be lowered by adding material to the passivation/tuning layer, and the frequency of the filter device passband can be increased by removing material to the passivation/tuning layer. Typically, the process 800 is biased to produce filter devices with passbands that are initially lower than a required frequency range but can be tuned to the desired frequency range by removing material from the surface of the passivation/tuning layer.

At 860, a probe card or other means may be used to make electrical connections with the filter to allow radio frequency (RF) tests and measurements of filter characteristics such as input-output transfer function. Typically, RF measurements are made on all, or a large portion, of the filter devices fabricated simultaneously on a common piezoelectric plate and substrate.

At 865, global frequency tuning may be performed by removing material from the surface of the passivation/tuning layer using a selective material removal tool such as, for example, a scanning ion mill as previously described. "Global" tuning is performed with a spatial resolution equal to or larger than an individual filter device. The objective of global tuning is to move the passband of each filter device towards a desired frequency range. The test results from 860 may be processed to generate a global contour map indicating the amount of material to be removed as a function of two-dimensional position on the wafer. The material is then removed in accordance with the contour map using the selective material removal tool.

At 870, local frequency tuning may be performed in addition to, or instead of, the global frequency tuning performed at 865. "Local" frequency tuning is performed with a spatial resolution smaller than an individual filter device. The test results from 860 may be processed to generate a map indicating the amount of material to be removed at each filter device. Local frequency tuning may require the use of a mask to restrict the size of the areas from which material is removed. For example, a first mask may be used to restrict tuning to only shunt resonators, and a second mask may be subsequently used to restrict tuning to only series resonators (or vice versa). This would allow independent tuning of the lower band edge (by tuning shunt resonators) and upper band edge (by tuning series resonators) of the filter devices.

After frequency tuning at 865 and/or 870, the filter device is completed at 875. Actions that may occur at 875 include forming bonding pads or solder bumps or other means for making connection between the device and external circuitry (if such pads were not formed at 845); excising individual filter devices from a wafer containing multiple filter devices; other packaging steps; and additional testing. After each filter device is completed, the process ends at 895.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or"

means that the listed items are alternatives, but the alternatives also include any combination of the listed items.

It is claimed:

1. A bulk acoustic resonator comprising:
   a substrate;
   a piezoelectric layer attached directly or by one or more intermediate layers to the substrate, the piezoelectric layer including a diaphragm over a cavity of the bulk acoustic resonator;
   a decoupling dielectric layer on a surface of the diaphragm and that extends continuously on the surface of the diaphragm, such that an entirety of the surface of the diaphragm is covered by the decoupling layer; and
   an interdigital transducer (IDT) with interleaved fingers on the decoupling layer such that the decoupling layer is between the IDT and the diaphragm of the piezoelectric layer.

2. The bulk acoustic resonator of claim 1, wherein the IDT and the piezoelectric layer are configured such that a radio frequency signal applied to the IDT excites a primary shear acoustic mode in the diaphragm, the primary shear acoustic mode being a bulk shear mode where acoustic energy propagates along a direction substantially orthogonal to the surface of the diaphragm, which is also substantially orthogonal to a primary direction of an electric field created between the interleaved fingers of the IDT.

3. The bulk acoustic resonator of claim 1, wherein the piezoelectric layer is rotated Y-cut lithium niobate.

4. The bulk acoustic resonator of claim 1, wherein the cavity extends at least partially in the substrate.

5. The bulk acoustic resonator of claim 1, wherein the decoupling dielectric layer is entirely disposed on a surface of the interleaved fingers of the IDT facing the surface of the diaphragm.

6. The bulk acoustic resonator of claim 1, wherein the decoupling layer is coupled directly between the diaphragm and the IDT.

7. The bulk acoustic resonator of claim 1, wherein Euler angles of the piezoelectric layer are 0°, β, 0°, and 30°<β<38°.

8. The bulk acoustic resonator of claim 1, wherein the decoupling dielectric layer comprises one of silicon dioxide, silicon nitride, and aluminum oxide.

9. The bulk acoustic resonator of claim 1, further comprising a dielectric layer on the decoupling dielectric layer between the interleaved fingers of the IDT.

10. The bulk acoustic resonator of claim 9,
    wherein the dielectric layer comprises at least one of silicon dioxide, silicon nitride, and aluminum oxide, and
    wherein the IDT comprises one of aluminum, an aluminum alloy, copper, a copper alloy, beryllium, gold, tungsten, molybdenum, chromium, and titanium.

11. A bulk acoustic resonator comprising:
    a substrate;
    a piezoelectric layer attached by one or more intermediate layers to the substrate, the piezoelectric layer including a diaphragm over a cavity of the acoustic resonator;
    a decoupling dielectric layer on a surface of the diaphragm; and
    an interdigital transducer (IDT) with interleaved fingers on the decoupling layer opposite the diaphragm,
    wherein a thickness of the piezoelectric layer is greater than or equal to 200 nm and less than or equal to 1000 nm, and
    wherein a thickness of the decoupling dielectric layer is greater than or equal to 0.05 times the thickness of the piezoelectric layer and less than or equal to 0.5 times the thickness of the piezoelectric layer.

12. A bulk acoustic resonator comprising:
    a substrate;
    a piezoelectric layer attached directly or by one or more intermediate layers to the substrate;
    a decoupling dielectric layer on the piezoelectric layer, the decoupling dielectric layer extending continuously on a surface of the piezoelectric layer; and
    an interdigital transducer (IDT) comprising a plurality of interleaved fingers extending alternately from first and second busbars, overlapping portions of the plurality of interleaved fingers disposed directly on the decoupling layer, such that the decoupling layer is between the interleaved fingers and the surface of the piezoelectric layer,
    wherein the decoupling layer extends continuously between the interleaved fingers of the IDT and the piezoelectric layer.

13. The bulk acoustic resonator of claim 12, wherein the IDT and the piezoelectric layer are configured such that a radio frequency signal applied between the first and second busbars excites a primary shear acoustic mode in the piezoelectric layer, the primary shear acoustic mode being a bulk shear mode where acoustic energy propagates along a direction substantially orthogonal to the surface of the piezoelectric layer, which is also substantially orthogonal to a primary direction of an electric field created between the interleaved fingers of the IDT.

14. The bulk acoustic resonator of claim 12, wherein a portion of the piezoelectric layer forms a diaphragm over a cavity of the acoustic resonator.

15. The bulk acoustic resonator of claim 14, wherein the cavity extends at least partially in the substrate.

16. The bulk acoustic resonator of claim 12, wherein the decoupling layer extends continuously on a surface of the diaphragm, such that an entirety of the surface of the diaphragm is covered by the decoupling layer.

17. The bulk acoustic resonator of claim 12, wherein the decoupling layer is coupled directly between the diaphragm and the IDT.

18. The bulk acoustic resonator of claim 12, wherein Euler angles of the piezoelectric layer are 0°, β, 0°, and 30°<β<38°.

19. The bulk acoustic resonator of claim 12,
    wherein a thickness of the piezoelectric layer is greater than or equal to 200 nm and less than or equal to 1000 nm, and
    wherein a thickness of the decoupling dielectric layer is greater than or equal to 0.05 times the thickness of the piezoelectric layer and less than or equal to 0.5 times the thickness of the piezoelectric layer.

20. The bulk acoustic resonator of claim 12, further comprising:
    a dielectric layer on the decoupling dielectric layer and between the interleaved fingers of the IDT,
    wherein the dielectric layer comprises at least one of silicon dioxide, silicon nitride, and aluminum oxide, and
    wherein the IDT comprises one of aluminum, an aluminum alloy, copper, a copper alloy, beryllium, gold, tungsten, molybdenum, chromium, and titanium.

* * * * *